(12) United States Patent
Ichikawa et al.

(10) Patent No.: US 11,069,852 B2
(45) Date of Patent: Jul. 20, 2021

(54) MAGNETORESISTANCE EFFECT ELEMENT

(71) Applicant: TDK CORPORATION, Tokyo (JP)

(72) Inventors: Shinto Ichikawa, Tokyo (JP);
Katsuyuki Nakada, Tokyo (JP);
Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/504,388

(22) Filed: Jul. 8, 2019

(65) Prior Publication Data
US 2020/0035913 A1    Jan. 30, 2020

(30) Foreign Application Priority Data

Jul. 26, 2018    (JP) .............................. JP2018-140548

(51) Int. Cl.
| | | |
|---|---|---|
| *H01L 43/10* | (2006.01) | |
| *G01R 33/09* | (2006.01) | |
| *G11B 5/39* | (2006.01) | |
| *H01L 27/22* | (2006.01) | |
| *H01L 43/08* | (2006.01) | |
| *B82Y 25/00* | (2011.01) | |

(52) U.S. Cl.
CPC ............ *H01L 43/10* (2013.01); *G01R 33/098* (2013.01); *G11B 5/3909* (2013.01);
(Continued)

(58) Field of Classification Search
CPC ....... H01L 43/10; H01L 27/222; H01L 43/08; G01R 33/098; G11B 5/3909; B82Y 25/00
See application file for complete search history.

(56) References Cited

U.S. PATENT DOCUMENTS

| | | | | |
|---|---|---|---|---|
| 2002/0159203 A1* | 10/2002 | Saito | .................... | G11B 5/3903 |
| | | | | 360/324.2 |
| 2009/0243007 A1* | 10/2009 | Buttet | ................... | H01F 41/307 |
| | | | | 257/421 |

(Continued)

FOREIGN PATENT DOCUMENTS

| | | |
|---|---|---|
| JP | 5586028 B2 | 9/2014 |
| JP | 5988019 B2 | 9/2016 |

OTHER PUBLICATIONS

Hiroaki Sukegawa et al., "MgGa2O4 spinel barrier for magnetic tunnel junctions: Coherent tunneling and low barrier height," Applied Physics Letters, vol. 110, pp. 122404-1-122404-5, 2017.

(Continued)

*Primary Examiner* — Fernando L Toledo
*Assistant Examiner* — Neil R Prasad
(74) *Attorney, Agent, or Firm* — Oliff PLC (57) ABSTRACT

A magnetoresistance effect element includes a first ferromagnetic layer, a second ferromagnetic layer, and a tunnel barrier layer that is interposed between the first ferromagnetic layer and the second ferromagnetic layer. The tunnel barrier layer is a stacked body including one or more high-barrier-height layers and one or more low-barrier-height layers, the one or more high-barrier-height layers having a relatively high barrier height with respect to the one or more low-barrier-height layers and the one or more low-barrier-height layers having a relatively low barrier height with respect to the one or more high-barrier-height layers. A minimum difference of barrier height between the one or more high-barrier-height layers and the one or more low-barrier-height layers is equal to or higher than 0.5 eV.

16 Claims, 3 Drawing Sheets

(52) U.S. Cl.
CPC ............ *H01L 27/222* (2013.01); *H01L 43/08* (2013.01); *B82Y 25/00* (2013.01)

(56) References Cited

U.S. PATENT DOCUMENTS

| | | |
|---|---|---|
| 2012/0091548 A1 | 4/2012 | Sukegawa et al. |
| 2013/0075843 A1* | 3/2013 | Inokuchi ................. H01L 43/08 257/421 |
| 2013/0221461 A1* | 8/2013 | Sukegawa ............... H01L 43/08 257/421 |
| 2017/0170392 A1* | 6/2017 | Sasaki ................... G11B 5/3906 |
| 2018/0090671 A1* | 3/2018 | Kato ....................... H01L 43/08 |

OTHER PUBLICATIONS

Hiroaki Sukegawa et al., "Tunnel magnetoresistance with improved bias voltage dependence in lattice-matched Fe/spinel MgAl2O4/Fe(001) junctions," Applied Physics Letters, vol. 96, pp. 212505-1-212505-3, 2010.

Yoshio Miura et al., "First-principles study of tunneling magnetoresistance in Fe/MgAl204 /Fe(001) magnetic tunnel functions," Physical Review B, vol. 86, 024426-1-024426-6, 2012.

Thomas Scheike et al., "Lattice-matched magnetic tunnel junctions using a Heusler alloy Co2FeAl and a cation-disorder spinel Mg—Al—O barrier," Applied Physics Letters, vol. 105, 242407-1-242407-5, 2014.

* cited by examiner

MAGNETORESISTANCE EFFECT ELEMENT

BACKGROUND OF THE INVENTION

Field of the Invention

The invention relates to a magnetoresistance effect element.

Priority is claimed on Japanese Patent Application No. 2018-140548, filed Jul. 26, 2018, the content of which is incorporated herein by reference.

Description of Related Art

A giant magnetoresistance (GMR) element including a multilayered film of a ferromagnetic layer and a nonmagnetic layer and a tunneling magnetoresistance (TMR) element using an insulating layer (a tunnel barrier layer, a barrier layer) as a nonmagnetic layer are known. In general, a TMR element has a higher element resistance than a GMR element, but has a higher magnetoresistance (MR) ratio than a GMR element. Accordingly, TMR elements have attracted attention as elements for a magnetic sensor, a high-frequency component, a magnetic head, and a magnetic random-access memory (MRAM).

TMR elements can be classified into two types depending on the difference of the mechanism of tunnel conduction of electrons. One type is a TMR element using only a penetration effect (a tunneling effect) of wave functions between ferromagnetic layers. The other type is a TMR element in which coherent tunneling (in which only electrons having symmetry of a specific wave function tunnel) using conduction of a specific orbit of a tunnel barrier layer which is tunneled when a tunneling effect occurs is dominant. It is known that a TMR element in which coherent tunneling is dominant provides a larger MR ratio than a TMR element using only a tunneling effect.

MgO is widely known as a material of a tunnel barrier layer in which a coherent tunneling effect is obtained. However, MgO has a large lattice mismatch with a ferromagnetic layer and many defects such as dislocation are generated in the tunnel barrier layer of MgO, and thus there is a problem in that a tunneling junction with high quality cannot be obtained. Accordingly, materials as substitutes for MgO have been studied. For example, Japanese Patent No. 5586028 discloses a magnetoresistance effect element using $MgAl_2O_4$ having a spinel structure as a material as a substitute for MgO.

Japanese Patent No. 5988019 discloses a magnetoresistance effect element using a nonmagnetic oxide having a disordered spinel structure as a tunnel barrier layer. According to Japanese Patent No. 5988019, a higher MR ratio is obtained in the disordered spinel structure as a result of comparison between a case in which a nonmagnetic oxide having a spinel structure is used as a tunnel barrier layer (Japanese Patent No. 5586028) and a case in which a nonmagnetic oxide having a disordered spinel structure is used as a tunnel barrier layer (Japanese Patent No. 5988019).

Use of an oxide having a relatively small resistance value as a tunnel barrier layer has also been studied. APPLIED PHYSICS LETTERS 110, 122404(2017) discloses a magnetoresistance effect element using $MgGa_2O_4$ having a spinel structure. It is known that $MgGa_2O_4$ exhibits a barrier height much lower than that of $MgAl_2O_4$.

SUMMARY OF THE INVENTION

In order to enhance an MR ratio of a magnetoresistance effect element, it is effective to decrease the thickness of a tunnel barrier layer using a high-barrier-height oxide having a high barrier height as a material of a tunnel barrier layer. Accordingly, a tunnel barrier layer of a magnetoresistance effect element generally has a thickness of less than 3 nm. However, when the thickness of the tunnel barrier layer is decreased, there is a concern that the tunnel barrier layer is likely to be destroyed when a high voltage is applied thereto and voltage resistance of the magnetoresistance effect element will decrease. In order to improve voltage resistance of a magnetoresistance effect element, increasing the thickness of a tunnel barrier layer using a tunnel barrier layer having a low resistance value can be considered. However, in this case, there is a problem in that the MR ratio of the magnetoresistance effect element is decreased.

The invention is made in consideration of the above-mentioned circumstances and an objective thereof is to provide a magnetoresistance effect element of which an MR ratio is not likely to decrease even when a thickness of a tunnel barrier layer increases.

The inventors have conducted studies to solve the above-mentioned problems and thus found that a thickness of a tunnel barrier layer can be increased without decreasing an MR ratio by forming the tunnel barrier layer is a stacked body including one or more high-barrier-height layers and one or more low-barrier-height layers, the one or more high-barrier-height layers having a relatively high barrier height with respect to the one or more low-barrier-height layers and the one or more low-barrier-height layers having a relatively low barrier height with respect to the one or more high-barrier-height layers, and setting a minimum difference of barrier height between the one or more low-barrier-height layers and the one or more high-barrier-height layers to be equal to or greater than 0.5 eV.

That is, the invention provides the following means for solving the above-mentioned problem.

(1) According to an aspect of the invention, a magnetoresistance effect element is provided, including: a first ferromagnetic layer; a second ferromagnetic layer; and a tunnel barrier layer that is interposed between the first ferromagnetic layer and the second ferromagnetic layer, wherein the tunnel barrier layer is a stacked body including one or more high-barrier-height layers and one or more low-barrier-height layers, the one or more high-barrier-height layers having a relatively high barrier height with respect to the one or more low-barrier-height layers and the one or more low-barrier-height layers having a relatively low barrier height with respect to the one or more high-barrier-height layers, and a minimum difference of barrier height between the one or more high-barrier-height layers and the one or more low-barrier-height layers is equal to or higher than 0.5 eV.

(2) In the magnetoresistance effect element according to the aspect, the barrier height of the one or more high-barrier-height layers may be equal to or higher than 6.0 eV.

(3) In the magnetoresistance effect element according to the aspect, the minimum difference of barrier height between the one or more high-barrier-height layers and the one or more low-barrier-height layers may be 1.0 eV or more and 5.0 eV or less.

(4) In the magnetoresistance effect element according to the aspect, the one or more high-barrier-height layers may be formed of a high-barrier-height oxide having a spinel structure which is an oxide including element A and element B, the element A being Mg or Zn and the element B being a metal element selected from the group consisting of Al, Ga, and In.

(5) In the magnetoresistance effect element according to the aspect, the high-barrier-height oxide may be an oxide including Mg and Al.

(6) In the magnetoresistance effect element according to the aspect, the oxide including Mg and Al may have a disordered spinel structure.

(7) In the magnetoresistance effect element according to the aspect, the one or more low-barrier-height layers may be formed of a low-barrier-height oxide having a spinel structure which is an oxide including element C, element D, and element E, the element C being Mg or Zn, the element D being a metal selected from a group consisting of Al, Ga, and In, and the element E being a metal element selected from the group consisting of Al, Ga, and In.

(8) In the magnetoresistance effect element according to the aspect, the low-barrier-height oxide may be an oxide including Mg, Al, and Ga.

(9) In the magnetoresistance effect element according to the aspect, the oxide including Mg, Al, and Ga may have a disordered spinel structure.

(10) In the magnetoresistance effect element according to the aspect, the tunnel barrier layer may be a stacked body including one of the high-barrier-height layer and one of the low-barrier-height layer which is stacked on one surface of the high-barrier-height layer.

(11) In the magnetoresistance effect element according to the aspect, the tunnel barrier layer may be a stacked body which includes two layers of the high-barrier-height layer, the low-barrier-height layer being interposed between the two layers of the high-barrier-height layer.

(12) In the magnetoresistance effect element according to the aspect, a thickness of the tunnel barrier layer may be equal to or greater than 3 nm.

(13) In the magnetoresistance effect element according to the aspect, a total thickness of the high-barrier-height layer may be equal to or less than 1 nm.

According to the invention, it is possible to provide a magnetoresistance effect element of which an MR ratio is not likely to decrease even when a thickness of a tunnel barrier layer increases.

DETAILED DESCRIPTION OF THE INVENTION

Hereinafter, the invention will be described in detail with reference to the accompanying drawings. In the drawings used for the following description, feature parts may be enlarged for the purpose of convenience and dimensional ratios of elements or the like may be different from actual values. Materials, dimensions, and the like described in the following description are examples, and the invention is not limited thereto and can be appropriately modified without departing from the gist of the invention.

First Embodiment

Figure 1:
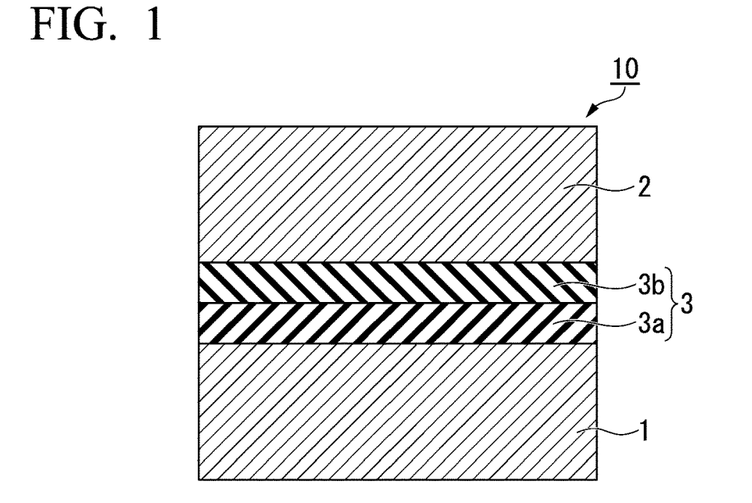
FIG. 1 is a sectional view schematically illustrating a magnetoresistance effect element according to a first embodiment of the invention.

FIG. 1 is a sectional view schematically illustrating a magnetoresistance effect element according to a first embodiment of the invention. The magnetoresistance effect element 10 illustrated in FIG. 1 includes a first ferromagnetic layer 1, a second ferromagnetic layer 2, and a tunnel barrier layer 3. The magnetoresistance effect element 10 may include a cap layer and a buffer layer in addition to the above-mentioned layers.

First Ferromagnetic Layer and Second Ferromagnetic Layer

The first ferromagnetic layer 1 and the second ferromagnetic layer 2 have magnetization. The magnetoresistance effect element 10 outputs a change in relative angle of the magnetization as a change in resistance value. For example, when a magnetization direction of the second ferromagnetic layer 2 is fixed and a magnetization direction of the first ferromagnetic layer 1 is set to be variable with respect to the magnetization direction of the second ferromagnetic layer 2, the magnetization direction of the first ferromagnetic layer 1 changes and thus the resistance value of the magnetoresistance effect element 10 changes. A layer in which a magnetization direction is fixed is generally referred to as a fixed layer, and a layer in which a magnetization direction is variable is generally referred to as a free layer. Since the change in resistance value is caused according to a change in relative angle of the magnetization, a configuration in which the magnetization of neither the first ferromagnetic layer 1 nor the second ferromagnetic layer 2 is fixed may be employed.

The first ferromagnetic layer 1 and the second ferromagnetic layer 2 include a ferromagnetic material. Examples of the ferromagnetic material include a metal selected from the group consisting of Cr, Mn, Co, Fe, and Ni, an alloy including one or more kinds of metals selected from this group, and an alloy including one or more metals selected from this group and one or more kinds of elements of B, C, and N. Particularly, Fe or a CoFe alloy has high spin polarizability and can increase an MR ratio of the magnetoresistance effect element 10 when it is used for the first ferromagnetic layer 1 or the second ferromagnetic layer 2. Examples of the first ferromagnetic layer 1 and the second ferromagnetic layer 2 include Co—Fe, Co—Fe—B, and Ni—Fe. When the first ferromagnetic layer 1 and the second ferromagnetic layer 2 are in-plane magnetized films, for example, a Co—Ho alloy (CoHo$_2$) or a Sm—Fe alloy (SmFe$_{12}$) can be preferably used.

The first ferromagnetic layer 1 and the second ferromagnetic layer 2 may be formed of a Heusler alloy such as Co$_2$FeSi. A Heusler alloy has high spin polarizability and can realize a high MR ratio. A Heusler alloy contains an intermetallic compound having a chemical composition of XYZ or X$_2$YZ. Here, X is a transition metal element or a noble metal element in the Co, Fe, Ni, or Cu group in the periodic table. Y is a transition metal in the Mn, V, Cr, or Ti group or the same element as X. Z is a typical element in Groups III to V. For example, Co$_2$FeSi, Co$_2$FeGe, Co$_2$FeGa, Co$_2$MnSi, Co$_2$Mn$_{1-a}$Fe$_a$Al$_b$Si$_{1-b}$, or Co$_2$FeGe$_{1-c}$Ga$_c$ can be used as the Heusler alloy. The Heusler alloy has high spin polarizability and can increase the MR ratio of the magnetoresistance effect element 10.

When the magnetization directions of the first ferromagnetic layer 1 and the second ferromagnetic layer 2 are set to be perpendicular to the stacked surface, it is preferable that the thickness be equal to or less than 3 nm. Perpendicular magnetic anisotropy is applied to the first ferromagnetic layer 1 and the second ferromagnetic layer 2 at an interface with the tunnel barrier layer 3. Since the effect of perpendicular magnetic anisotropy is attenuated by increasing the thicknesses of the first ferromagnetic layer 1 and the second ferromagnetic layer 2, it is preferable that the thicknesses of the first ferromagnetic layer 1 and the second ferromagnetic layer 2 be small.

When the first ferromagnetic layer 1 is formed as a fixed layer and the second ferromagnetic layer 2 is formed as a free layer, a coercive force of the first ferromagnetic layer 1 is set to be greater than a coercive force of the second ferromagnetic layer 2. A minimum difference of coercive force can be adjusted using materials constituting the ferromagnetic layers, layers adjacent to the ferromagnetic layers, or the like. For example, a material having a greater coercive force than a material constituting the second ferromagnetic layer 2 may be used for the first ferromagnetic layer 1 or an antiferromagnetic material such as IrMn or PtMn may be made to be adjacent to the first ferromagnetic layer 1. In order to prevent a magnetic field leaking from the first ferromagnetic layer 1 from affecting the second ferromagnetic layer 2, a synthetic ferromagnetic coupling structure may be employed.

Tunnel Barrier Layer

The tunnel barrier layer 3 is formed as a stacked body having a two-layer structure including a high-barrier-height layer 3a having a relatively high barrier height (a barrier wall) and a low-barrier-height layer 3b having a relatively low barrier height which is stacked on one surface (a top surface in FIG. 1) of the high-barrier-height layer 3a. A difference in barrier height between the high-barrier-height layer 3a and the low-barrier-height layer 3b is equal to or greater than 0.5 eV, preferably ranges from 1.0 eV to 5.0 eV, and more preferably ranges from 2.0 eV to 5.0 eV. The barrier heights of the high-barrier-height layer 3a and the low-barrier-height layer 3b are values in a bulk state.

The barrier height of the high-barrier-height layer 3a is preferably equal to or greater than 6.0 eV and more preferably ranges from 7.0 eV to 9.0 eV. The high-barrier-height layer 3a of which the barrier height is in the range exhibits an effect of improving an MR ratio of the magnetoresistance effect element 10. The thickness of the high-barrier-height layer 3a is preferably equal to or less than 1 nm. When the thickness of the high-barrier-height layer 3a is equal to or less than 1 nm, a band-folding effect between the first ferromagnetic layer 1 and the high-barrier-height layer 3a is suppressed and the MR ratio of the magnetoresistance effect element 10 is further improved. On the other hand, when the thickness of the high-barrier-height layer 3a is excessively small, there is a concern that the function as a tunnel barrier may deteriorate. Accordingly, it is preferable that the thickness of the high-barrier-height layer 3a be equal to or greater than 0.2 nm.

The barrier height of the low-barrier-height layer 3b is preferably equal to or less than 7.0 eV and more preferably ranges from 3.0 eV to 6.5 eV. Since the low-barrier-height layer 3b of which the barrier height is in the range generally has a low resistance value, the MR ratio of the magnetoresistance effect element 10 is not likely to decrease even when the thickness increases. The thickness of the low-barrier-height layer 3b is preferably set to a thickness with which the thickness of the tunnel barrier layer 3 is equal to or greater than 3 nm. When the thickness of the tunnel barrier layer 3 is equal to or greater than 3 nm, the tunnel barrier layer 3 is not likely to be destroyed even when a high voltage is applied thereto, and voltage resistance of the magnetoresistance effect element 10 is improved. Here, when the thickness of the tunnel barrier layer 3 is excessively large, there is a concern that the MR ratio of the magnetoresistance effect element 10 will decrease. Accordingly, the thickness of the tunnel barrier layer 3 is preferably equal to or less than 6 nm and more preferably equal to or less than 5 nm.

It is preferable that the high-barrier-height layer 3a and the low-barrier-height layer 3b be formed of an oxide having a spinel structure. When both the high-barrier-height layer 3a and the low-barrier-height layer 3b have a spinel structure, lattice-matching ability therebetween is improved. An oxide having a spinel structure is generally expressed by a stoichiometric composition formula $AB_2O_4$. In this embodiment, deviation of the spinel structure from the stoichiometric composition is allowed. The spinel structure of the high-barrier-height layer 3a and the low-barrier-height layer 3b is not limited to a regular spinel structure and includes a disordered spinel structure.

Figure 2:
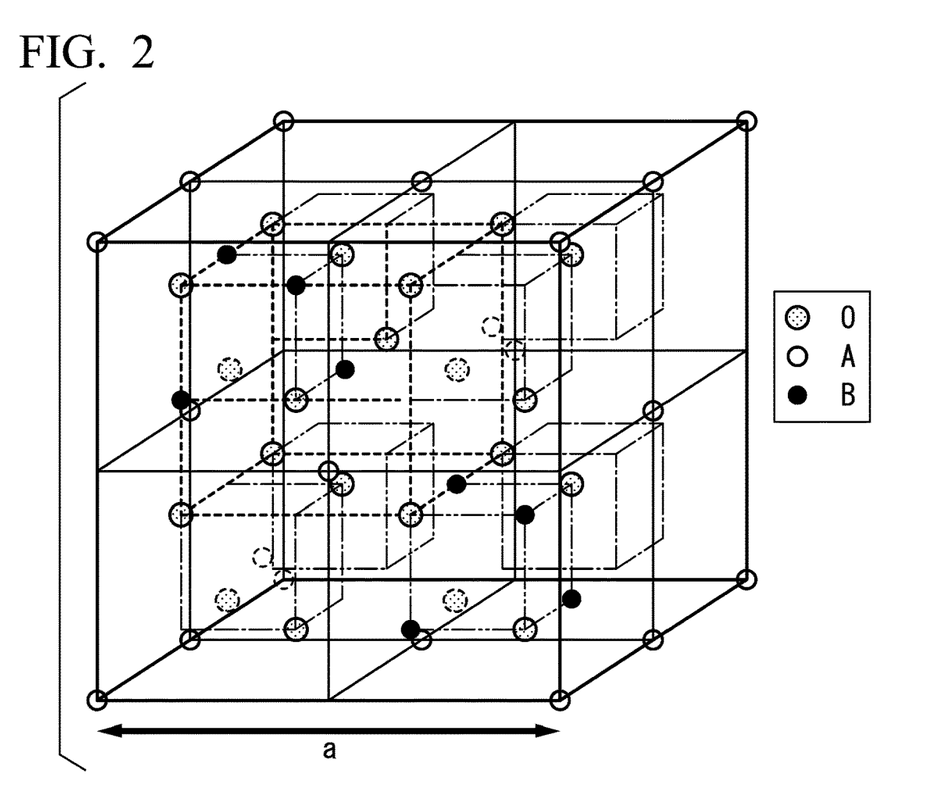
FIG. 2 is a diagram illustrating a crystal structure of a spinel structure.

FIG. 2 is a diagram schematically illustrating a crystal structure of a regular spinel structure. In the regular spinel structure, as illustrated in FIG. 2, a site which element A enters (an A site) and a site which element B enters (a B site) are fixed and arrangement of the elements is regular.

Figure 3:
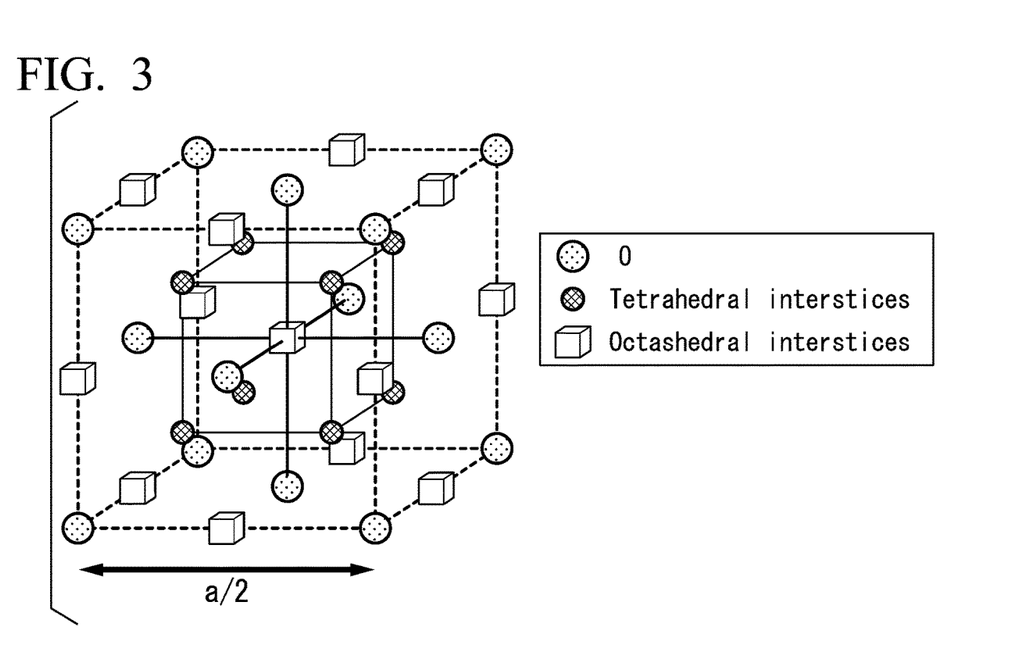
FIG. 3 is a diagram illustrating a crystal structure of a disordered spinel structure.

On the other hand, FIG. 3 is a diagram schematically illustrating a crystal structure of a disordered spinel structure. In the disordered spinel structure, element A or element B can be present in any of a site (site A) coordinating tetrahedrally with oxygen and a site (site B) coordinately octahedrally with oxygen, as illustrated in FIG. 3. The site which element A or element B enters is randomly determined. When element A and element B having different atom radii enter the sites, the crystal structure becomes irregular. A lattice constant (a/2) of the disordered spinel structure is substantially a half of the lattice constant (a) of the regular spinel structure.

A high-barrier-height oxide forming the high-barrier-height layer 3a preferably includes an oxide containing element A and element B. The element A is Mg or Zn, and the element B is one kind of metal selected from the group consisting of Al, Ga, and In. The content proportions of element A, element B, and oxygen are not particularly limited and can be content proportions in which an oxide having a spinel structure can be formed. Examples of the high-barrier-height oxide include Mg—Al—O, Mg—Ga—O, Mg—In—O, Zn—Al—O, Zn—Ga—O, and Zn—In—O. Among these oxides, Mg—Al—O can be preferably used. Mg—Al—O preferably has a disordered spinel structure.

The high-barrier-height layer 3a may be formed of an oxide having a spinel structure not containing element A (for example, α-alumina). The high-barrier-height layer 3a may be formed of an oxide not having a spinel structure (for example, MgO).

A low-barrier-height oxide forming the low-barrier-height layer 3b preferably includes an oxide containing element C, element D, and element E. The element C is Mg or Zn, the element D is at least one kind of metal selected from the group consisting of Al, Ga, and In, and the element E is at least one kind of metal selected from the group consisting of Al, Ga, and In. The content proportions of the element C, the element D, the element E, and oxygen are not particularly limited and can be content proportions in which an oxide having a spinel structure can be formed. Examples of the low-barrier-height oxide include Mg—Al—O, Mg—Al—Ga—O, Mg—Al—In—O, Mg—Ga—O, Mg—Ga—In—O, Mg—In—O, Zn—Al—O, Zn—Al—Ga—O, Zn—Al—In—O, Zn—Ga—O, Zn—Ga—In—O, and Zn—In—O. Among these oxides, Mg—Al—Ga—O can be preferably used. Mg—Al—Ga—O preferably has a disordered spinel structure.

When the tunnel barrier layer has a spinel structure or a disordered spinel structure, the ratio of site A and site B does not have to be 1:2. An oxygen content does not have to comply to a stoichiometric composition, and oxygen may be deficient or excessive.

The high-barrier-height layer 3a and the low-barrier-height layer 3b may be formed of an oxide including the same kind of metal element as long as the minimum difference of barrier height therebetween is equal to or greater than 0.5 eV. For example, the high-barrier-height layer 3a and the low-barrier-height layer 3b may be formed of an oxide including element A and element B or may be formed of an oxide including element C, element D, and element E.

A preferable combination of the high-barrier-height layer 3a and the low-barrier-height layer 3b is a combination in which the high-barrier-height layer 3a is formed of Mg—Al—O having a disordered spinel structure and the low-barrier-height layer 3b is formed of Mg—Al—Ga—O having a disordered spinel structure. In this case, since lattice-matching ability between the high-barrier-height layer 3a and the low-barrier-height layer 3b is improved, the MR ratio of the magnetoresistance effect element 10 is improved and voltage resistance is improved. By forming the high-barrier-height layer 3a and the low-barrier-height layer 3b in a disordered spinel structure, a band-folding effect between the first ferromagnetic layer 1 and the second ferromagnetic layer 2 and the tunnel barrier layer 3 is suppressed and the MR ratio of the magnetoresistance effect element 10 is further improved.

Shape and Dimension of Element

The stacked body including the first ferromagnetic layer 1, the tunnel barrier layer 3, and the second ferromagnetic layer 2 which constitute the magnetoresistance effect element 10 has a pillar shape. The shape of the stacked body in a plan view can have various shapes such as a circle, a tetragon, a triangle, and a polygon and is preferably a circle in view of symmetry. That is, the stacked body preferably has a columnar shape.

When the stacked body has a columnar shape, the diameter thereof in a plan view is preferably equal to or less than 80 nm, more preferably equal to or less than 60 nm, and still more preferably equal to or less than 30 nm. When the diameter is equal to or less than 80 nm, a domain structure in a ferromagnetic layer is not possible and it is not necessary to consider a component other than spin polarization in the ferromagnetic layer. When the diameter is equal to or less than 30 nm, a single domain structure is formed in the ferromagnetic layer and a magnetization switching speed or probability is improved. In a miniaturized magnetoresistance effect element, there is strong demand for a decrease in resistance.

Method of Manufacturing Magnetoresistance Effect Element

A method of manufacturing a magnetoresistance effect element will be described below.

The method of manufacturing a magnetoresistance effect element according to this embodiment includes a step of stacking the first ferromagnetic layer, the tunnel barrier layer, and the second ferromagnetic layer. Known methods such as a sputtering method, a vapor deposition method, a laser ablation method, and a molecular beam epitaxial (MBE) method can be used as the method of forming the layers.

The tunnel barrier layer can be formed by stacking the high-barrier-height layer and then stacking a low-barrier-height layer thereon. The high-barrier-height layer can be formed, for example, using a method including a step of forming a metal film including a metal element contained in a high-barrier-height oxide forming the high-barrier-height layer, a step of oxidizing the formed metal film to acquire an oxide film, and performing heat treatment on the oxide film.

A sputtering method can be used as the method of forming the metal film. For example, a method of performing sputtering using an alloy target containing element A and element B and a method of performing co-sputtering using a target containing element A and a target containing element B can be used.

A plasma oxidation method or a natural oxidation method based on introduction of oxygen can be used as the method of oxidizing the metal film. The heat treatment of the oxide film varies depending on a composition of the oxide and is preferably performed in a vacuum at a temperature range of 350° C. or more and 500° C. or less in general.

The method of forming the high-barrier-height layer is not limited to the above-mentioned method. For example, an oxide film may be directly formed using a target of a high-barrier-height oxide.

Similarly to the high-barrier-height layer, the low-barrier-height layer can be formed, for example, using a method including a step of forming a metal film including a metal element contained in a low-barrier-height oxide forming the low-barrier-height layer, a step of oxidizing the formed metal film to acquire an oxide film, and performing heat treatment on the oxide film.

As described above, in the magnetoresistance effect element 10 according to the first embodiment, the tunnel barrier layer 3 is formed as a stacked body including one high-barrier-height layer 3a and one low-barrier-height layer 3b. Accordingly, by decreasing the thickness of the high-barrier-height layer 3a and increasing the thickness of the low-barrier-height layer 3b, it is possible to increase the thickness of the tunnel barrier layer without decreasing the MR ratio.

Second Embodiment

Figure 4:
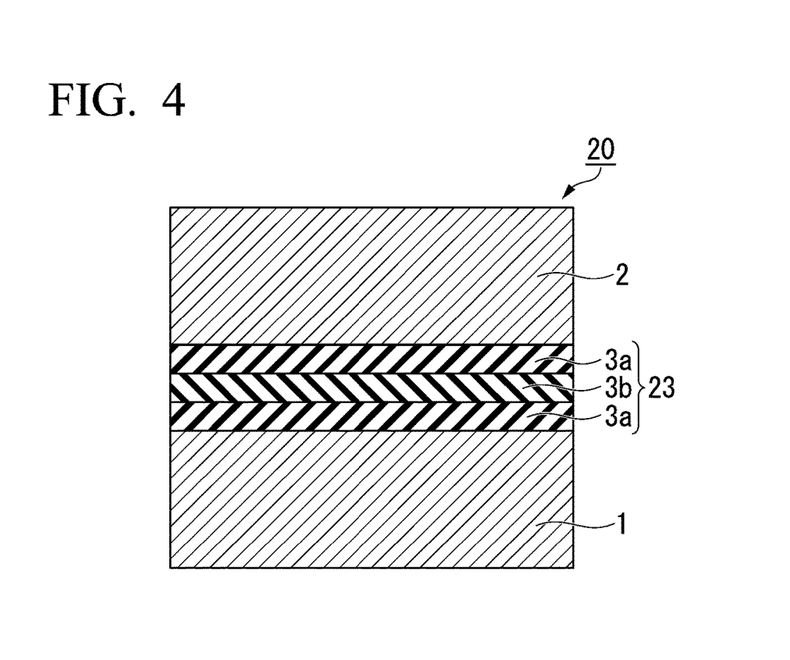
FIG. 4 is a sectional view schematically illustrating a magnetoresistance effect element according to a second embodiment of the invention.

FIG. 4 is a sectional view schematically illustrating a magnetoresistance effect element according to a second embodiment. In the magnetoresistance effect element 20 according to the second embodiment, the same elements as those in the magnetoresistance effect element 10 according to the first embodiment will be referred to by the same reference signs and description thereof will not be repeated.

In the magnetoresistance effect element 20 illustrated in FIG. 4, a tunnel barrier layer 23 is formed as a stacked body having a three-layer structure in which two high-barrier-height layers 3a are provided and a low-barrier-height layer 3b is interposed between the two high-barrier-height layers 3a. The tunnel barrier layer 23 preferably has a three-layer structure of Mg—Al—O/Mg—Al—Ga—O/Mg—Al—O. Mg—Al—O and Mg—Al—Ga—O preferably have a disordered spinel structure.

Since the high-barrier-height layer 3a in the magnetoresistance effect element 20 are in contact with an interface with a ferromagnetic material, the magnetoresistance effect element 20 achieves a higher MR ratio. Particularly, when the high-barrier-height layer 3a have a disordered spinel structure, the band-folding effect between the ferromagnetic layers of the first ferromagnetic layer 1 and the second ferromagnetic layer 2 and the tunnel barrier layer 23 is suppressed and thus the magnetoresistance effect element 20 achieves a higher MR ratio. The thickness of one layer of the high-barrier-height layer 3a is preferably equal to or less than 1 nm.

Others

The magnetoresistance effect element 10 may have a top pin structure in which a magnetization-fixed layer is farther from a substrate than a magnetization-free layer and a bottom pin structure in which a magnetization-fixed layer is closer to a substrate than a magnetization-free layer.

In the magnetoresistance effect element 10 according to the first embodiment, the tunnel barrier layer 3 is formed as a stacked body of one high-barrier-height layer 3a and one low-barrier-height layer 3b. In the magnetoresistance effect element 20 according to the second embodiment, the tunnel barrier layer 23 is formed as a stacked body of two high-barrier-height layers 3a and one low-barrier-height layer 3b. The number of layers is not particularly limited as long as the tunnel barrier layer 3 or 23 includes high-barrier-height layer 3a and low-barrier-height layer 3b. For example, three high-barrier-height layers 3a may be provided and two low-barrier-height layers 3b may be provided. It is preferable that the barrier layer having a higher crystallinity be disposed to be in contact with the first ferromagnetic layer 1 and the second ferromagnetic layer 2. The total thickness of the tunnel barrier layer is preferably equal to or less than 3 nm.

The tunnel barrier layer 3 or 23 may further include a third barrier layer which is different in barrier height from the high-barrier-height layer 3a and the low-barrier-height layer 3b. In this case, it is preferable that the third barrier layer has a barrier height which is an intermediate value between the barrier heights of the high-barrier-height layer 3a and the low-barrier-height layer 3b and be interposed between the high-barrier-height layer 3a and the low-barrier-height layer 3b.

As described above, the magnetoresistance effect elements according to the embodiments can be effectively used as a memory such as an MRAM.

EXAMPLES

Example 1

The magnetoresistance effect element 10 illustrated in FIG. 1 was manufactured. First, a MgO (001) single-crystal substrate was prepared as a substrate, a Cr layer with a thickness of 40 nm was formed as a buffer layer (also serving as a first wire 31 to be described later) on the substrate, and an Fe layer with a thickness of 30 nm was stacked as the first ferromagnetic layer 1 thereon.

Then, an MgAl alloy film was formed on the first ferromagnetic layer 1 using a sputtering method using an MgAl alloy target. The thickness of the MgAl alloy film was adjusted such that the thickness of an MgAlO film (a high-barrier-height layer 3a) generated by an oxidation process was 0.9 nm. Subsequently, the MgAl alloy film was subjected to an oxidization process to form an MgAlO film and then heat treatment was performed thereon to form a high-barrier-height layer 3a. The oxidization process was performed by exposing the MgAl alloy film to the air under a pressure of 5 Pa for 600 seconds. The heat treatment was performed by heating the MgAlO film in vacuum at 400° C. for 15 minutes.

Subsequently, an MgAlGa alloy film was formed on the high-barrier-height layer 3a using a sputtering method using an MgAlGa alloy target. The thickness of the MgAlGa alloy film was adjusted such that the thickness of an MgAlGaO film (a low-barrier-height layer 3b) generated by an oxidization process ranged from 0.1 nm to 5.7 nm. The MgAlGa alloy film was subjected to an oxidization process to form an MgAlGaO film and then heat treatment was performed thereon to form a low-barrier-height layer 3b. The conditions of the oxidization process and the heat treatment were set to be the same as in the high-barrier-height layer 3a. In this way, the tunnel barrier layer 3 was stacked on the first ferromagnetic layer 1.

Then, Fe was formed at a thickness of 6 nm as a second ferromagnetic layer 2 on the tunnel barrier layer 3 to obtain a ferromagnetic tunnel junction. IrMn was formed at a thickness of 12 nm as an antiferromagnetic layer on the second ferromagnetic layer 2, and Ru was formed at a thickness of 20 nm as a cap layer (also serving as a second wire 32 to be described later) thereon to obtain a magnetoresistance effect element 10. Finally, the resultant was heated at a temperature of 175° C. while applying a magnetic field of 5 kOe thereto, whereby uniaxial magnetic anisotropy was given to the second ferromagnetic layer 2.

As described above, the magnetoresistance effect element 10 in which the tunnel barrier layer 3 has a two-layer structure of an MgAlO layer and an MgAlGaO layer was manufactured. The materials and the thicknesses of the layers of the magnetoresistance effect element 10 are described in Table 1.

Example 2

The magnetoresistance effect element 20 illustrated in FIG. 4 was manufactured in the same way as in Example 1 except that a tunnel barrier layer was formed as follows.

An MgAl alloy film was formed on the first ferromagnetic layer 1 using a sputtering method, in which the thickness thereof was adjusted such that the thickness of an MgAlO film (a high-barrier-height layer 3a) generated by an oxidization process was 0.9 nm. Subsequently, the MgAl alloy film was subjected to an oxidization process to form an MgAlO film and then heat treatment was performed thereon to form a high-barrier-height layer 3a.

Subsequently, an MgAlGa alloy film was formed on the high-barrier-height layer 3a using a sputtering method using an MgAlGa alloy target in the same way as in Example 1, except that the thickness thereof was adjusted such that the thickness of an MgAlGaO film (a low-barrier-height layer 3b) generated by an oxidization process ranged from 0.2 nm to 3.8 nm. The MgAlGa alloy film was subjected to an oxidization process to form an MgAlGaO film and then heat treatment was performed thereon to form a low-barrier-height layer 3b.

An MgAl alloy film was formed on the low-barrier-height layer 3b using a sputtering method, in which the thickness thereof was adjusted such that the thickness of an MgAlO film (a high-barrier-height layer 3a) generated by an oxidization process was 0.9 nm. Then, the MgAl alloy film was subjected to an oxidization process to form an MgAlO film and then heat treatment was performed thereon to form a high-barrier-height layer 3a.

The conditions of the oxidization process and the heat treatment were set to be the same as in Example 1.

As described above, the magnetoresistance effect element 20 in which the tunnel barrier layer 23 had a three-layer structure of an MgAlO layer, an MgAlGaO layer, and an MgAlO layer was manufactured. The materials and the thicknesses of the layers of the magnetoresistance effect element 20 are described in Table 1.

Example 3

The magnetoresistance effect element 20 illustrated in FIG. 4 was manufactured in the same way as in Example 1 except that a tunnel barrier layer was formed as follows.

An MgAl alloy film was formed on the first ferromagnetic layer 1 using a sputtering method, in which the thickness thereof was adjusted such that the thickness of an MgAlO film (a high-barrier-height layer 3a) generated by an oxidization process was 0.45 nm. Subsequently, the MgAl alloy film was subjected to an oxidization process to form an MgAlO film and then heat treatment was performed thereon to form a high-barrier-height layer 3a.

Subsequently, an MgAlGa alloy film was formed on the high-barrier-height layer 3a using a sputtering method using an MgAlGa alloy target in the same way as in Example 1, except that the thickness thereof was adjusted such that the thickness of an MgAlGaO film (a low-barrier-height layer 3b) generated by an oxidization process ranged from 0.1 nm to 5.7 nm. The MgAlGa alloy film was subjected to an oxidization process to form an MgAlGaO film and then heat treatment was performed thereon to form a low-barrier-height layer 3b.

An MgAl alloy film was formed on the low-barrier-height layer 3b using a sputtering method, in which the thickness thereof was adjusted such that the thickness of an MgAlO film (a high-barrier-height layer 3a) generated by an oxidization process was 0.45 nm. Then, the MgAl alloy film was subjected to an oxidization process to form an MgAlO film and then heat treatment was performed thereon to form a high-barrier-height layer 3a.

The conditions of the oxidization process and the heat treatment were set to be the same as in Example 1.

As described above, the magnetoresistance effect element 20 in which the tunnel barrier layer 23 had a three-layer structure of an MgAlO layer, an MgAlGaO layer, and an MgAlO layer was manufactured. The materials and the thicknesses of the layers of the magnetoresistance effect element 20 are described in Table 1.

Example 4

The magnetoresistance effect element 20 illustrated in FIG. 4 was manufactured in the same way as in Example 1 except that a tunnel barrier layer was formed as follows.

An MgAl alloy film was formed on the first ferromagnetic layer 1 using a sputtering method, in which the thickness thereof was adjusted such that the thickness of an MgAlO film (a high-barrier-height layer 3a) generated by an oxidization process was 0.45 nm. Subsequently, the MgAl alloy film was subjected to an oxidization process to form an MgAlO film and then heat treatment was performed thereon to form a high-barrier-height layer 3a.

Subsequently, an ZnAl alloy film was formed on the high-barrier-height layer 3a using a sputtering method using an ZnAl alloy target in the same way as in Example 1, except that the thickness thereof was adjusted such that the thickness of an ZnAlO film (a low-barrier-height layer 3b) generated by an oxidization process ranged from 0.1 nm to 5.7 nm. The ZnAl alloy film was subjected to an oxidization process to form a ZnAlO film and then heat treatment was performed thereon to form a low-barrier-height layer 3b.

An MgAl alloy film was formed on the low-barrier-height layer 3b using a sputtering method, in which the thickness thereof was adjusted such that the thickness of an MgAlO film (a high-barrier-height layer 3a) generated by an oxidization process was 0.45 nm. Then, the MgAl alloy film was subjected to an oxidization process to form an MgAlO film and then heat treatment was performed thereon to form a high-barrier-height layer 3a. The conditions of the oxidization process and the heat treatment were set to be the same as in Example 1.

As described above, the magnetoresistance effect element 20 in which the tunnel barrier layer 23 had a three-layer structure of an MgAlO layer, a ZnAlO layer, and an MgAlO layer was manufactured. The materials and the thicknesses of the layers of the magnetoresistance effect element 20 are described in Table 1.

Comparative Example 1

A magnetoresistance effect element in which a tunnel barrier layer had a single-layer structure of an MgAlO layer was manufactured in the same way as in Example 1 except that an MgAlGaO film (a low-barrier-height layer 3b) was not formed in the tunnel barrier layer and an MgAlO film (a high-barrier-height layer 3a) was formed such that the thickness thereof ranged from 1.0 nm to 3.5 nm. The materials and the thicknesses of the layers of the magnetoresistance effect element are described in Table 1.

Comparative Example 2

A magnetoresistance effect element described in Table 1 was manufactured in the same way as in Example 1 except that a tunnel barrier layer was formed as follows. An MgGa$_2$O$_4$ film was formed on the first ferromagnetic layer 1 while adjusting it such that the thickness thereof ranged from 1.2 nm to 3.2 nm, and heat treatment was performed thereon to form a tunnel barrier layer. The conditions of the heat treatment were set to be the same as in Example 1. In this way, a magnetoresistance effect element in which the tunnel barrier layer had a single-layer structure of an MgGa$_2$O$_4$ layer was manufactured. The materials and the thicknesses of the layers of the magnetoresistance effect element are described in Table 1.

TABLE 1

| | Element | Material | Thickness (nm) |
|---|---|---|---|
| Example 1 | Second ferromagnetic layer | Fe | 6 |
| | Tunnel barrier layer | — | 1.0-6.6 |
| | Low-barrier-height layer | MgAlGaO | 0.1-5.7 |
| | High-barrier-height layer 3a | MgAlO | 0.9 |
| | First ferromagnetic layer | Fe | 30 |
| Example 2 | Second ferromagnetic layer | Fe | 6 |
| | Tunnel barrier layer | — | 2.0-5.6 |
| | High-barrier-height layer | MgAlO | 0.9 |
| | Low-barrier-height layer | MgAlGaO | 0.2-3.8 |
| | High-barrier-height layer 3a | MgAlO | 0.9 |
| | First ferromagnetic layer | Fe | 30 |
| Example 3 | Second ferromagnetic layer | Fe | 6 |
| | Tunnel barrier layer | — | 1.0-6.6 |
| | High-barrier-height layer | MgAlO | 0.45 |
| | Low-barrier-height layer | MgAlGaO | 0.1-5.7 |
| | High-barrier-height layer 3a | MgAlO | 0.45 |
| | First ferromagnetic layer | Fe | 30 |

TABLE 1-continued

| | Element | Material | Thickness (nm) |
|---|---|---|---|
| Example 4 | Second ferromagnetic layer | Fe | 6 |
| | Tunnel barrier layer | — | 1.0-6.6 |
| | High-barrier-height layer | MgAlO | 0.45 |
| | Low-barrier-height layer | ZnAlO | 0.1-5.7 |
| | High-barrier-height layer 3a | MgAlO | 0.45 |
| | First ferromagnetic layer | Fe | 30 |
| Comparative Example 1 | Second ferromagnetic layer | Fe | 6 |
| | Tunnel barrier layer | MgAlO | 1.0-3.5 |
| | First ferromagnetic layer | Fe | 30 |
| Comparative Example 2 | Second ferromagnetic layer | Fe | 6 |
| | Tunnel barrier layer | MgGa$_2$O$_4$ | 1.2-3.2 |
| | First ferromagnetic layer | Fe | 30 |

Values (bulk values) of the barrier heights of the tunnel barrier layers of the magnetoresistance effect elements manufactured in Examples 1 to 4 and Comparative Examples 1 and 2 and documents in which the values of the barrier heights are described are shown in Table 2. MgAlGaO$_4$ has a spinel structure with the same crystal structure as MgAl$_2$O$_4$ and MgGa$_2$O$_4$ and the barrier height can have a value in a range of 4.9 eV or more and 7.8 eV or less depending on a composition ratio of Al and Ga.

From the barrier height values described in Table 2, it can be seen that the barrier height value of MgAlO can have a value in a range of 7.58 eV or more and 8.7 eV or less depending on a composition ratio of Mg and Al. Particularly, it can be seen that the barrier height values of MgO to MgAl$_2$O$_4$ have a value in a range of 7.58 eV or more and 7.8 eV or less. On the other hand, it can be seen from the result of comparison between MgAl$_2$O$_4$ and MgGa$_2$O$_4$ that MgAlGaO has a barrier height value less than MgAlO. From the result of comparison between MgAl$_2$O$_4$ and ZnAl$_2$O$_4$, it can be seen that ZnAlO has a barrier height value less than MgAlO.

TABLE 2

| Material of tunnel barrier layer | Barrier height (eV) | Document |
|---|---|---|
| MgO | 7.58 | PHYSICAL REVIEW B 43 (1991) 4461 |
| Al$_2$O$_3$ | 8.7 | PHYSICAL REVIEW B 43 (1991) 4461 |
| MgAl$_2$O$_4$ | 7.8 | PHYSICAL REVIEW B 43 (1991) 4461 |
| MgAlGaO$_4$ | 4.9-7.8 | |
| MgGa$_2$O$_4$ | 4.9 | Physica Status Solidi A212 (2015) 1455 |
| ZnAl$_2$O$_4$ | 3.85 | Journal of the American Ceramic Society 81 (1998) 649 |

Content proportions (an atomic ratio) of metal components of the tunnel barrier layers in the magnetoresistance effect elements manufactured in Examples 1 to 4 and Comparative Examples 1 and 2 were measured as follows. As a result, the content proportions of the metal components in the tunnel barrier layer were almost the same as the content proportions of the metal components of the alloy targets used to form the tunnel barrier layers.

Method of Measuring Content Proportions of Metal Components

The magnetoresistance effect elements were cut along a plane parallel to the stacking direction thereof using a focused ion beam to manufacture thin piece samples of the tunnel barrier layers. Compositions of the thin piece samples were analyzed by energy dispersive X-ray analysis (EDS) in a transmission electron microscope (TEM). The analysis method is not limited thereto, and secondary ion mass spectroscopy (SIMS), an atom probe method, or electron energy loss spectroscopy may be used.

The crystal structures of the tunnel barrier layers in the manufactured magnetoresistance effect elements were measured as follows. As a result, it was ascertained that all the tunnel barrier layers had a disordered spinel structure.

Method of Measuring Crystal Structure

The thin piece samples of the tunnel barrier layers manufactured as described above were irradiated with an electron beam which was narrowed to a diameter of about 1 nm using a transmission electron microscope (TEM), the crystal structures were specified depending on the resultant nano beam electron diffraction (NBD) pattern, and it was ascertained that the tunnel barrier layers had a disordered spinel structure.

The MR ratios of the manufactured magnetoresistance effect elements were measured as follows. The results are illustrated as a graph in which the thicknesses of the tunnel barrier layers (the total thicknesses of the high-barrier-height layer and the low-barrier-height layer in Examples 1 to 4) are plotted in the horizontal axis and the MR ratios are plotted in the vertical axis in FIG. 6.

Method of Measuring MR Ratio

Figure 5:
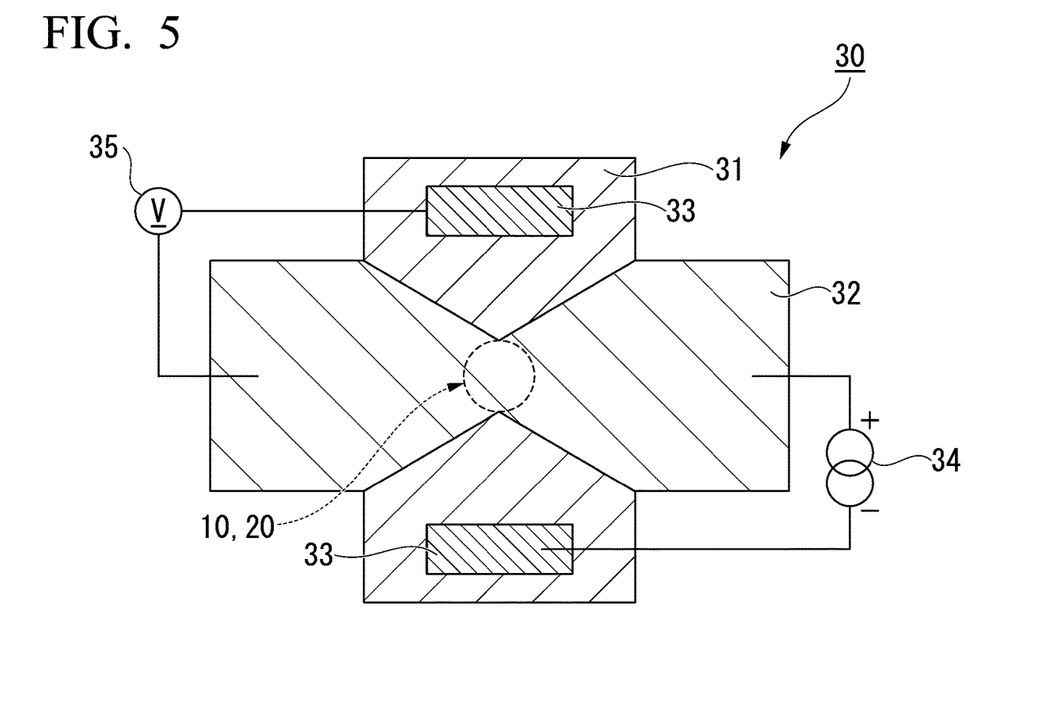
FIG. 5 is a plan view schematically illustrating a magnetoresistance effect device which is used to measure an MR ratio of a magnetoresistance effect element manufactured in an example when seen in a stacking direction.

FIG. 5 is a plan view schematically illustrating a magnetoresistance effect device 30 used to measure an MR ratio of the magnetoresistance effect element when seen in the stacking direction. The magnetoresistance effect elements 10 and 20 were disposed at a position at which a first wire 31 and a second wire 32 intersect each other. The magnetoresistance effect elements 10 and 20 were formed in a columnar shape with a diameter of 80 nm. An electrode 33 was provided in the first wire 31, and the electrode 33 was connected to a power supply 34 and a voltmeter 35. By applying a voltage using the power supply 34, a current flowed in the stacking direction of the magnetoresistance effect element 10. Potential differences of the magnetoresistance effect elements 10 and 20 were monitored by the voltmeter 35. Changes in resistance of the magnetoresistance effect elements 10 and 20 were observed by applying a current or a voltage to the magnetoresistance effect elements 10 and 20 while scanning the magnetoresistance effect elements 10 and 20 with a magnetic field from the outside.

The MR ratio was calculated using the following equation.

$$MR\ \text{ratio}\ (\%) = (R_{AP} - R_P)/R_P \times 100$$

$R_P$ represents resistance when the magnetization directions of the first ferromagnetic layer 1 and the second ferromagnetic layer 2 were parallel to each other, and $R_{AP}$ represents resistance when the magnetization directions of the first ferromagnetic layer 1 and the second ferromagnetic layer 2 were antiparallel to each other.

Figure 6:
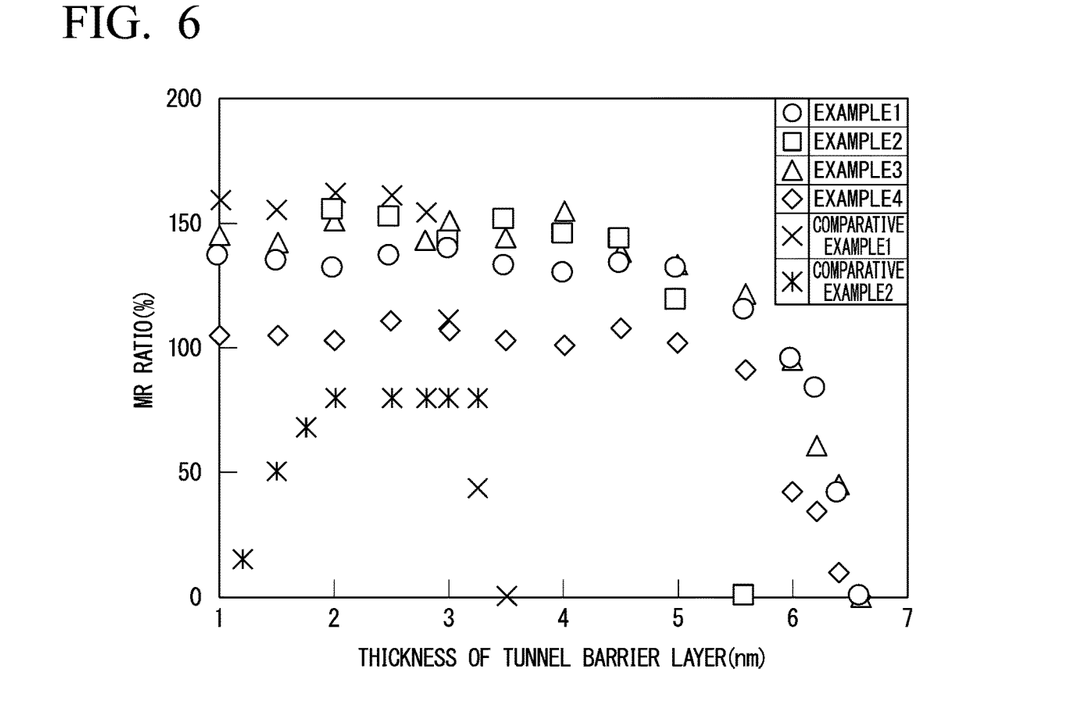
FIG. 6 is a graph illustrating a relationship between a thickness of a tunnel barrier layer and an MR ratio of a magnetoresistance effect element manufactured in an example.

In the magnetoresistance effect elements manufactured in Examples 1 to 4, it was ascertained from the graph illustrated in FIG. 6 that the MR ratios thereof exhibited a high value equal to or greater than 100% even when the tunnel barrier layers were 5 nm thick. Particularly, the magnetoresistance effect elements according to Examples 2 and 3 in which the tunnel barrier layer had a three-layer structure of an MgAlO layer, an MgAlGaO layer, and an MgAlO layer had improved MR ratios in comparison with the magnetoresistance effect element according to Example 1 in which the tunnel barrier layer had a two-layer structure of an MgAlO layer and an MgAlGaO layer.

On the other hand, in the magnetoresistance effect element according to Comparative Example 1 in which the tunnel barrier layer had a single-layer structure of an MgAlO layer, the MR ratio was rapidly decreased when the thickness of the tunnel barrier layer became equal to or greater than 3 nm. In the magnetoresistance effect element according to Comparative Example 2 in which the tunnel barrier layer had a single-layer structure of an MgGa$_2$O$_4$ layer, a decrease in MR ratio was not observed even when the thickness of the tunnel barrier layer became equal to or greater than 3 nm, but the MR ratio was decreased as a whole.

According to the invention, it is possible to provide a magnetoresistance effect element of which an MR ratio is not likely to decrease even when a thickness of a tunnel barrier layer increases.

EXPLANATION OF REFERENCES 10, 20 . . . Magnetoresistance effect element
1 . . . First ferromagnetic layer
2 . . . Second ferromagnetic layer
3, 23 . . . Tunnel barrier layer
3a . . . High-barrier-height layer
3b . . . Low-barrier-height layer
30 . . . Magnetoresistance effect device
31 . . . First wire
32 . . . Second wire
33 . . . Electrode
34 . . . Power supply
35 . . . Voltmeter

What is claimed is:

1. A magnetoresistance effect element, comprising:
a first ferromagnetic layer;
a second ferromagnetic layer; and
a tunnel barrier layer that is interposed between the first ferromagnetic layer and the second ferromagnetic layer,
wherein the tunnel barrier layer is a stacked body including two or more high-barrier-height layers and one or more low-barrier-height layers, the two or more high-barrier-height layers having a relatively high barrier height with respect to the one or more low-barrier-height layers and the one or more low-barrier-height layers having a relatively low barrier height with respect to the two or more high-barrier-height layers,
wherein a minimum difference of barrier height between the two or more high-barrier-height layers and the one or more low-barrier-height layers is equal to or higher than 0.5 eV,
wherein the high-barrier-height layer is formed of a high-barrier-height oxide, which is an oxide including Mg and Al,
wherein the oxide including Mg and Al has a disordered spinel structure, and
wherein the tunnel barrier layer is a stacked body which includes two layers of the high-barrier-height layer, the low-barrier-height layer being interposed between the two layers of the high-barrier-height layer.

2. The magnetoresistance effect element according to claim 1, wherein the barrier height of the two or more high-barrier-height layers are equal to or higher than 6.0 eV.

3. The magnetoresistance effect element according to claim 1, wherein the minimum difference in barrier height between the two or more high-barrier-height layers and the one or more low-barrier-height layers is 1.0 eV or more and 5.0 eV or less.

4. The magnetoresistance effect element according to claim 2, wherein the minimum difference in barrier height between the two or more high-barrier-height layers and the one or more low-barrier-height layers is 1.0 eV or more and 5.0 eV or less.

5. The magnetoresistance effect element according to claim 1, wherein the two or more high-barrier-height layers are formed of a high-barrier-height oxide having a spinel structure which is an oxide including element A and element B, the element A being Mg or Zn and the element B being a metal element selected from the group consisting of Al, Ga, and In.

6. The magnetoresistance effect element according to claim 2, wherein the two or more high-barrier-height layers are formed of a high-barrier-height oxide having a spinel structure which is an oxide including element A and element B, the element A being Mg or Zn and the element B being a metal element selected from the group consisting of Al, Ga, and In.

7. The magnetoresistance effect element according to claim 3, wherein the two or more high-barrier-height layers are formed of a high-barrier-height oxide having a spinel structure which is an oxide including element A and element B, the element A being Mg or Zn and the element B being a metal element selected from the group consisting of Al, Ga, and In.

8. The magnetoresistance effect element according to claim 4, wherein the two or more high-barrier-height layers are formed of a high-barrier-height oxide having a spinel structure which is an oxide including element A and element B, the element A being Mg or Zn and the element B being a metal element selected from the group consisting of Al, Ga, and In.

9. The magnetoresistance effect element according to claim 1, wherein the one or more low-barrier-height layers are formed of a low-barrier-height oxide having a spinel structure which is an oxide including element C, element D, and element E, the element C being Mg or Zn, the element D being a metal selected from a group consisting of Al, Ga, and In, and the element E being a metal element selected from the group consisting of Al, Ga, and In.

10. The magnetoresistance effect element according to claim 9, wherein the low-barrier-height oxide is an oxide including Mg, Al, and Ga.

11. The magnetoresistance effect element according to claim 10, wherein the oxide including Mg, Al, and Ga has a disordered spinel structure.

12. The magnetoresistance effect element according to claim 1, wherein the tunnel barrier layer is a stacked body including one of the high-barrier-height layer and one of the low-barrier-height layer stacked on one surface of the one of high-barrier-height layer.

13. The magnetoresistance effect element according to claim 1, wherein a thickness of the tunnel barrier layer is equal to or greater than 3 nm.

14. The magnetoresistance effect element according to claim 1, wherein a total thickness of the high-barrier-height layer is equal to or less than 1 nm.

15. The magnetoresistance effect element according to claim 1, wherein the low-barrier-height layer is formed of low-barrier-height oxide, which is an oxide including Mg, Al, and Ga, and
wherein the oxide including Mg, Al, and Ga has a disordered spinel structure.

16. A magnetoresistance effect element, comprising:
a first ferromagnetic layer;
a second ferromagnetic layer; and a tunnel barrier layer that is interposed between the first ferromagnetic layer and the second ferromagnetic layer, wherein the tunnel barrier layer is a stacked body including two or more high-barrier-height layers and one or more low-barrier-height layers, the two or more high-barrier-height layers having a relatively high barrier height with respect to the one or more low-barrier-height layers and the one or more low-barrier-height layers having a relatively low barrier height with respect to the two or more high-barrier-height layers, wherein a minimum difference of barrier height between the two or more high-barrier-height layers and the one or more low-barrier-height layers is equal to or higher than 0.5 eV, wherein the tunnel barrier layer is a stacked body which includes two layers of the high-barrier-height layer, the low-barrier-height layer being interposed between the two layers of the high-barrier-height layer, wherein the high-barrier-height-layer is formed of a high-barrier-height oxide which is an oxide including Mg and Al, wherein the low-barrier-height-layer is formed of a low-barrier-height oxide which is an oxide including Mg, Al, and Ga, and wherein the tunnel barrier layer is a stacked body which includes two layers of the high-barrier-height layer, the low-barrier-height layer being interposed between the two layers of the high-barrier-height layer.

* * * * *